(12) United States Patent
Maebashi et al.

(10) Patent No.: US 9,758,115 B2
(45) Date of Patent: Sep. 12, 2017

(54) BUS BAR PLATE, ELECTRONIC COMPONENT UNIT, AND WIRE HARNESS

(71) Applicant: Yazaki Corporation, Tokyo (JP)

(72) Inventors: Akemi Maebashi, Shizuoka (JP); Pharima Akanitsuk, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/041,194

(22) Filed: Feb. 11, 2016

(65) Prior Publication Data

US 2016/0242305 A1    Aug. 18, 2016

(30) Foreign Application Priority Data

Feb. 12, 2015 (JP) ................. 2015-025812

(51) Int. Cl.
*H05K 1/02* (2006.01)
*B60R 16/023* (2006.01)
(Continued)

(52) U.S. Cl.
CPC .......... *B60R 16/0238* (2013.01); *H05K 1/116* (2013.01); *H05K 1/183* (2013.01);
(Continued)

(58) Field of Classification Search
CPC ...... H05K 3/3447; H05K 1/116; H05K 1/184; H05K 2201/09036; H05K 2201/10651;
(Continued)

(56) References Cited

U.S. PATENT DOCUMENTS

| 4,361,862 A | * | 11/1982 | Martyniak | ............. | H05K 1/119 |
| | | | | | 361/760 |
| 5,774,028 A | * | 6/1998 | Kim | ......................... | H01G 4/40 |
| | | | | | 333/181 |

(Continued)

FOREIGN PATENT DOCUMENTS

| JP | 57041677 U1 | 8/1980 |
| JP | 05013892 A | 1/1993 |

(Continued)

OTHER PUBLICATIONS

Communication dated Oct. 25, 2016, from the Japanese Patent Office in counterpart application No. 2015-025812.
Communication dated Jan. 24, 2017, from the Japanese Patent Office in counterpart application No. 2015-025812.

(Continued)

*Primary Examiner* — James Wu
(74) *Attorney, Agent, or Firm* — Sughrue Mion, PLLC (57) ABSTRACT

An electronic component unit and a wire harness include a bus bar plate. The bus bar plate is equipped with a resistor that has a main body and a pair of terminals protruding from the main body, and a substrate main body in which a metallic bus bar is built in a resin material and which has a component mounting section with the resistor mounted thereon. The component mounting section includes a pair of through-holes that penetrates the resin material and the bus bar and allows the terminals to pass, and a recess that is provided between the pair of through-holes, extends in a straight line shape connecting the pair of through-holes, and is capable of supporting the main body of the resistor.

8 Claims, 6 Drawing Sheets

(51) Int. Cl.
    *H05K 3/34* (2006.01)
    *H05K 1/11* (2006.01)
    *H05K 1/18* (2006.01)
(52) U.S. Cl.
    CPC ........... *H05K 1/184* (2013.01); *H05K 3/3447* (2013.01); *H05K 2201/09036* (2013.01); *H05K 2201/10651* (2013.01)
(58) Field of Classification Search
    CPC ......... H05K 1/183; H05K 2201/09472; H05K 2201/091; B60R 16/0238
    USPC .......................................... 174/255; 361/730
    See application file for complete search history.

(56) References Cited

U.S. PATENT DOCUMENTS

| | | | | |
|---|---|---|---|---|
| 5,902,138 | A | * | 5/1999 | Murakami ........... H01R 9/2466 439/76.2 |
| 6,377,732 | B1 | * | 4/2002 | Li .......................... G02B 6/132 385/49 |
| 2013/0250489 | A1 | | 9/2013 | Toda et al. |

FOREIGN PATENT DOCUMENTS

| | | | |
|---|---|---|---|
| JP | 05160541 | A | 6/1993 |
| JP | 08228479 | A | 9/1996 |
| JP | 2013-198347 | A | 9/2013 |

OTHER PUBLICATIONS

Communication dated Jun. 7, 2017, issued by the State Intellectual Property Office of the P.R.C. in corresponding Chinese Application No. 201610083049.7.

* cited by examiner

BUS BAR PLATE, ELECTRONIC COMPONENT UNIT, AND WIRE HARNESS

CROSS-REFERENCE TO RELATED APPLICATION(S)

The present application claims priority to and incorporates by reference the entire contents of Japanese Patent Application No. 2015-025812 filed in Japan on Feb. 12, 2015.

BACKGROUND OF THE INVENTION

1. Field of the Invention

The present invention relates to a bus bar plate, an electronic component unit, and a wire harness.

2. Description of the Related Art

As a conventional electronic component unit mounted on a vehicle such as an automobile, for example, Japanese Laid-open Patent Publication No. 2013-198347 discloses an electronic component module which has an electronic component substrate in which a plurality of bus bars is attached to an insulating plate and a plurality of electronic components is electrically connected to the plurality of bus bars, and a case that houses the electronic component substrate, and in which external terminal connecting units disposed on each bus bar are collected to form a connector connecting unit. In the electronic component module, since the connector connecting unit is disposed between the plurality of electronic components, the size reduction of the unit is attained.

Incidentally, in the electronic component unit described in Japanese Laid-open Patent Publication No. 2013-198347, for example, on mounting the electronic components on an electronic component substrate (a plate), it is necessary to position the electronic components at a predetermined position. However, in some cases, depending on the shapes of the electronic components, although it is difficult to position the electronic components at a predetermined position of the electronic component substrate, there is a need for a configuration that can position the electronic components at a predetermined position of the electronic component substrate (the plate) and can improve the workability at the time of assembling.

SUMMARY OF THE INVENTION

The present invention has been made in view of the above circumstances, and an object thereof is to provide a bus bar plate, an electronic component unit and a wire harness capable of improving the workability at the time of assembling.

In order to achieve the above mentioned object, a bus bar plate according to one aspect of the present invention includes an electronic component having a main body and a pair of terminals protruding from the main body; and a substrate main body in which a metallic bus bar is built in a resin material and which has a component mounting section with the electronic component mounted thereon. Herein, the component mounting section includes a pair of through-holes that penetrates the resin material and the bus bar and allows the terminals to pass; and a recess that is provided between the pair of through-holes, extends in a straight line shape connecting the pair of through-holes, and is capable of supporting the main body of the electronic component.

Further, in the bus bar plate according to another aspect of the present invention, the recess is formed integrally with the resin material.

Further, in the bus bar plate according to still another aspect of the present invention, the recess is formed in a V-shaped cross-section.

In order to achieve the above mentioned object, an electronic component unit according to still another aspect of the present invention includes a bus bar plate equipped with an electronic component that has a main body and a pair of terminals protruding from the main body, and a substrate main body in which a metallic bus bar is built in a resin material and which has a component mounting section with the electronic component mounted thereon; and a housing in which the bus bar plate is internally assembled. Herein, the component mounting section includes a pair of through-holes that penetrates the resin material and the bus bar and allows the terminals to pass; and a recess that is provided between the pair of through-holes, extends in a straight line shape connecting the pair of through-holes, and is capable of supporting the main body of the electronic component.

In order to achieve the above mentioned object, a wire harness according to still another aspect of the present invention includes an electronic component unit that is provided with a bus bar plate, and a housing in which the bus bar plate is internally assembled, the bus bar plate being equipped with an electronic component that has a main body and a pair of terminals protruding from the main body, and a substrate main body in which a metallic bus bar is built in a resin material and which has a component mounting section with the electronic component mounted thereon; and an electric wire that is electrically connected to the electronic component unit. Herein, the component mounting section includes a pair of through-holes that penetrates the resin material and the bus bar and allows the terminals to pass; and a recess that is provided between the pair of through-holes, extends in a straight line shape connecting the pair of through-holes, and is capable of supporting the main body of the electronic component.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described below in detail with reference to the drawings. The present invention is not limited to the embodiment. Further, constituent elements in the embodiment include elements easily replaceable by those skilled in the art or substantially identical elements.

Embodiment

Figure 1:
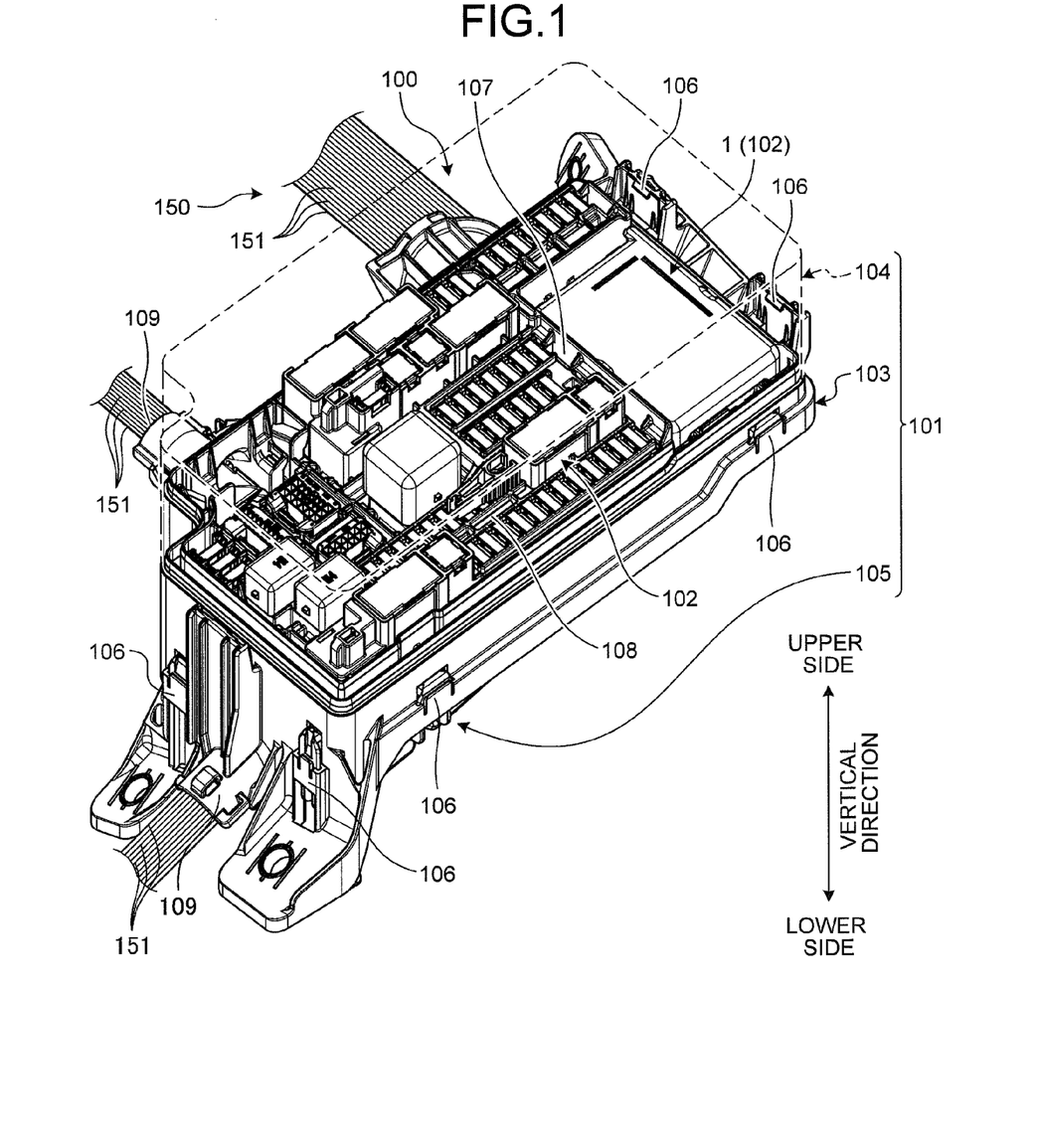
FIG. 1 is a perspective view illustrating a schematic configuration of an electric connection box and a wire harness to which an electronic component unit according to an embodiment is applied.
Figure 2:
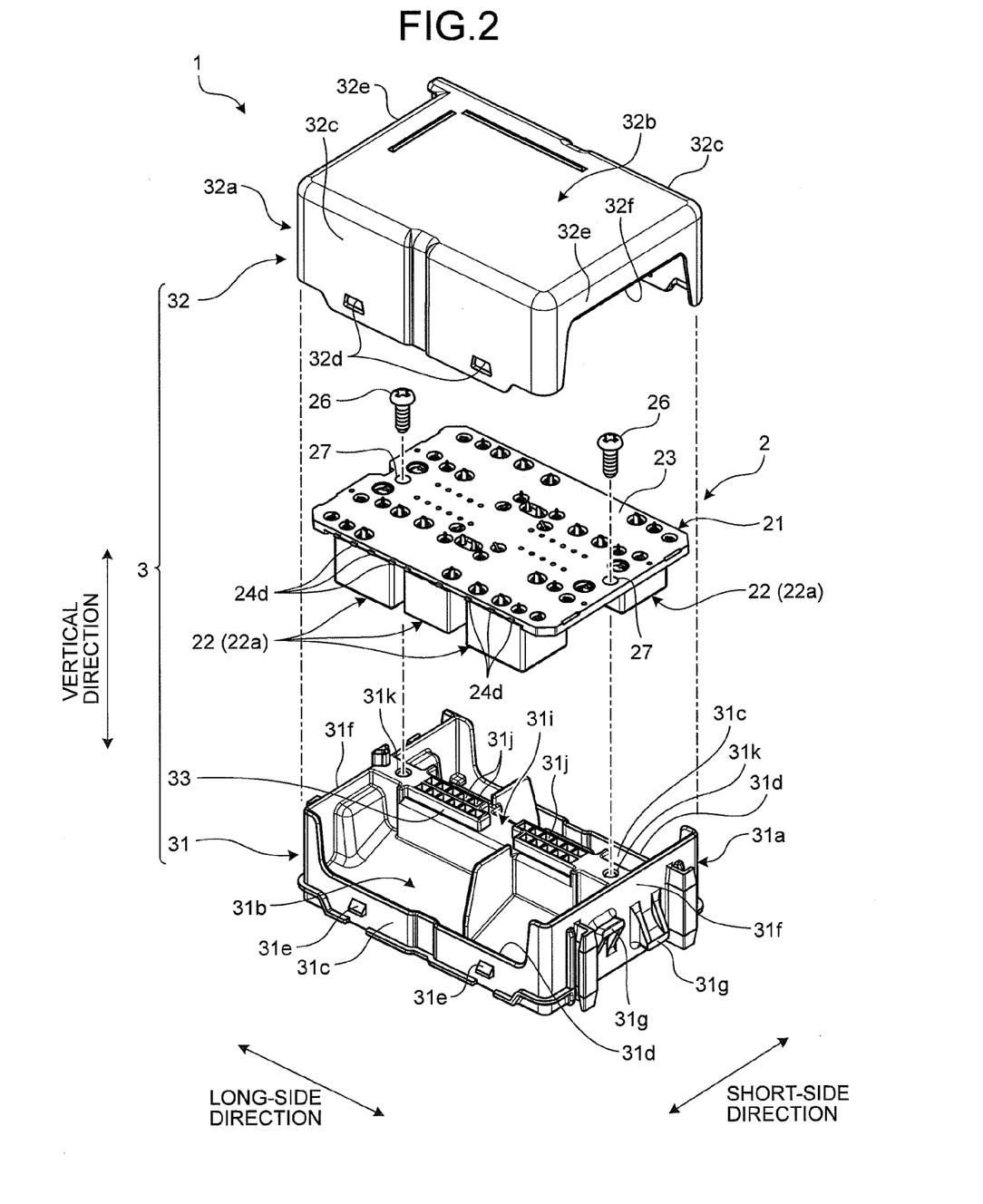
FIG. 2 is an exploded perspective view illustrating a schematic configuration of the electronic component unit according to the embodiment.
Figure 3:
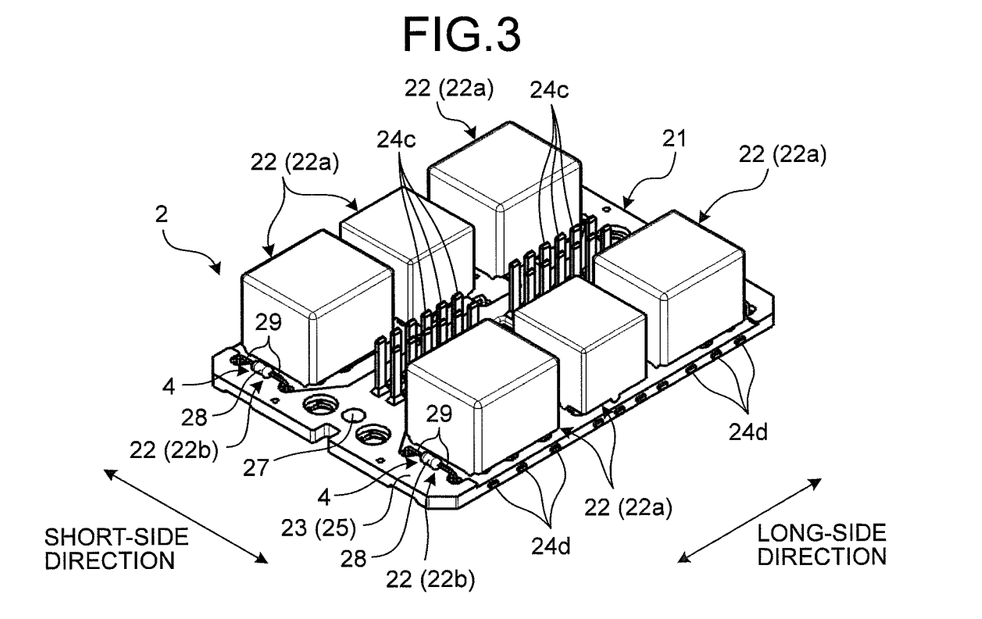
FIG. 3 is a perspective view illustrating a schematic configuration of a bus bar plate of the electronic component unit according to the embodiment.
Figure 4:
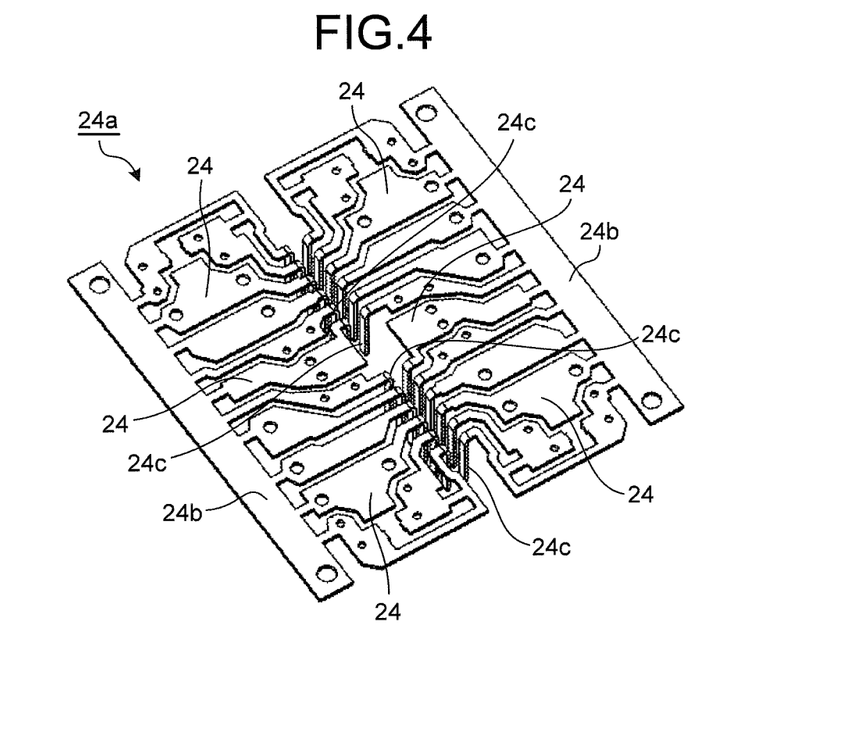
FIG. 4 is a perspective view illustrating a bus bar of a bus bar plate according to the embodiment.
Figure 5:
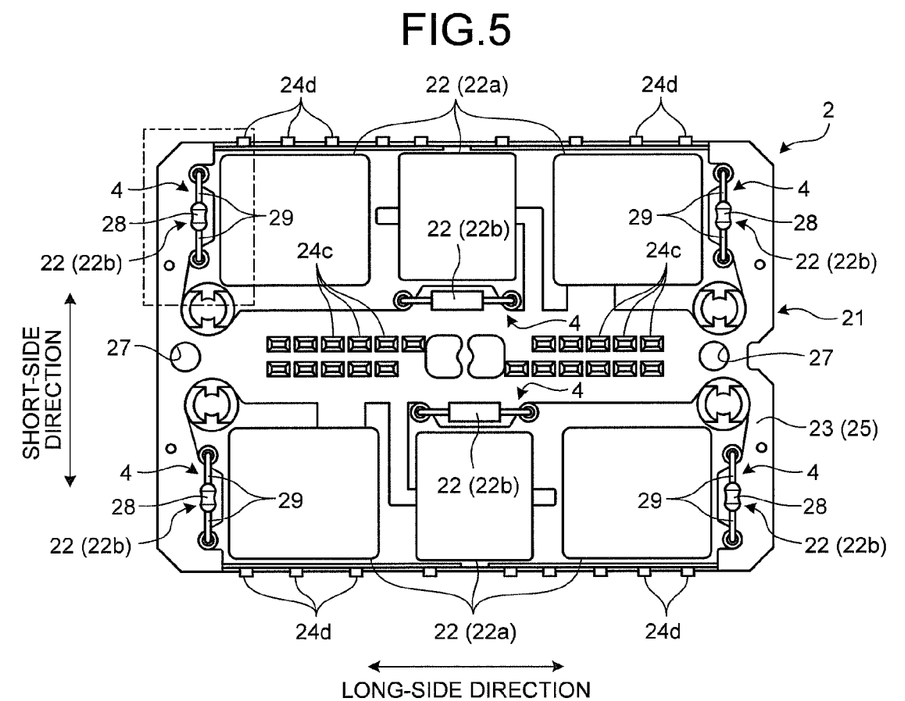
FIG. 5 is a plan view illustrating a schematic configuration of the bus bar plate of the electronic component unit according to the embodiment.
Figure 6:
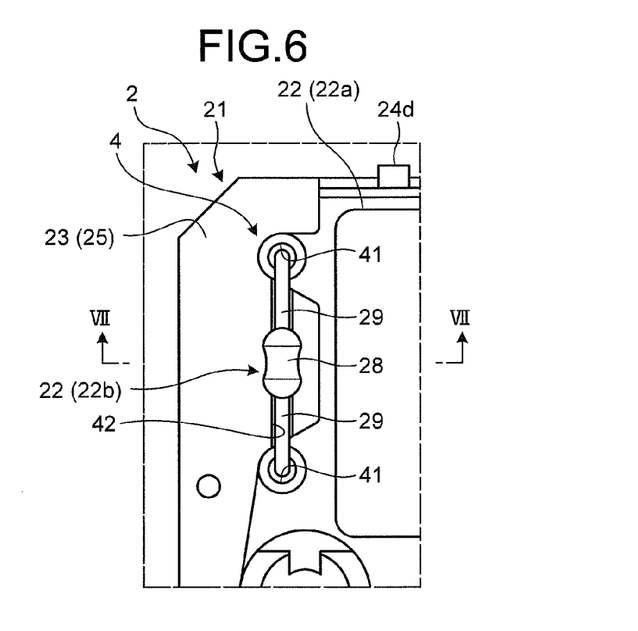
FIG. 6 is a plan view of a component mounting section of the bus bar plate of the electronic component unit according to the embodiment.
Figure 7:
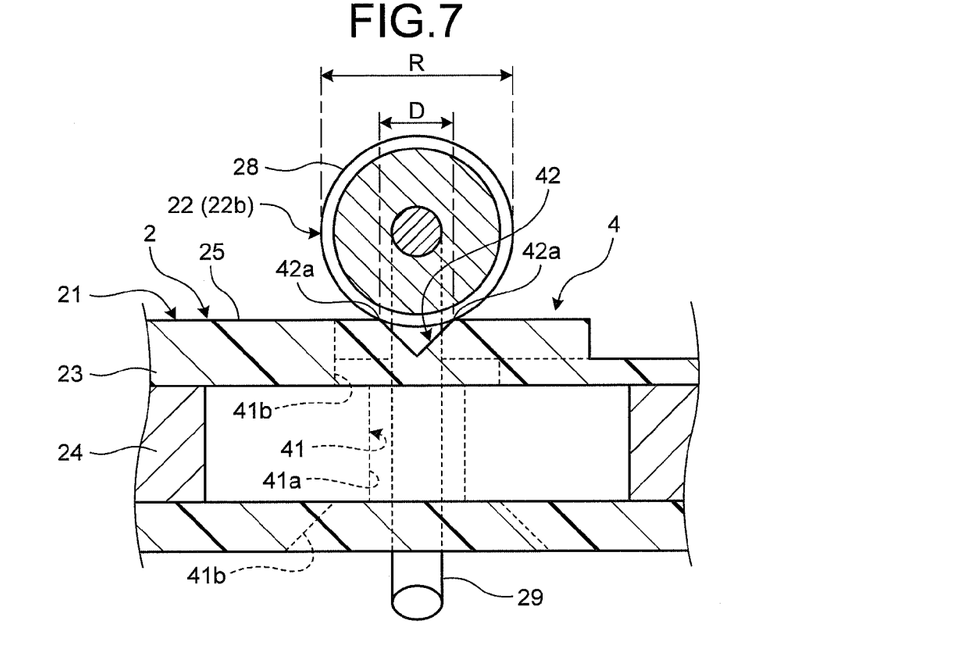
FIG. 7 is a cross-sectional view taken along the line VII-VII of FIG. 6.

FIG. 1 is a perspective view illustrating a schematic configuration of an electric connection box to which an electronic component unit according to the embodiment is applied. FIG. 2 is an exploded perspective view illustrating a schematic configuration of the electronic component unit according to the embodiment. FIG. 3 is a perspective view illustrating the schematic configuration of the bus bar plate of the electronic component unit according to the embodiment. FIG. 4 is a perspective view illustrating a bus bar of a bus bar plate according to the embodiment. FIG. 5 is a plan view illustrating a schematic configuration of the bus bar plate of the electronic component unit according to the embodiment. FIG. 6 is a plan view of a component mounting section of the bus bar plate of the electronic component unit according to the embodiment. FIG. 7 is a cross-sectional view taken along the line VII-VII of FIG. 6. Further, FIG. 1 illustrates an upper cover of the electric connection box by a two-dot chain line.

As illustrated in FIG. 1, an electronic component unit 1 according to this embodiment constitutes an electronic component module that is detachably assembled to an electric connection box 100 mounted on a vehicle such as an automobile. Here, the electric connection box 100 is incorporated in a wire harness 150, and is intended to aggregate and house electric components such as a connector, a fuse, a relay, a branch and an electronic control unit that make up connection processing components such as electric wires 151 therein. The electric connection box 100, for example, is installed in an engine room of the vehicle and a lower portion of a vehicle body, and is connected between a power supply such as a battery and various electronic devices mounted inside the vehicle. The electric connection box 100 distributes the power supplied from the power supply into the various electronic devices in the vehicle. In some cases, although the electric connection box 100 is referred to as a junction box, a fuse box, a relay box or the like, in this embodiment, those are collectively referred to as an electric connection box.

In the electric connection box 100 illustrated in FIG. 1, various electronic components 102 are housed in a housing space inside a box main body 101. The box main body 101, for example, is configured to include a body 103, an upper cover 104, a lower cover 105 and the like. The box main body 101 has a three-layer division structure in which the body 103, the upper cover 104 and the lower cover 105 are divided. The body 103, the upper cover 104 and the lower cover 105 are formed of an insulating synthetic resin. The body 103 is a main member which forms a housing space in which the electronic components 102 are assembled. The body 103 is formed in a substantially square tubular shape, and in a state in which the electric connection box 100 is connected to the engine room or the like, an opening is located on a vertically upper side and a vertically lower side. The upper cover 104 is a lid-like member that closes the opening of the vertically upper side of the body 103. The lower cover 105 is a dish-like (tray-like) member that closes the opening of the vertically lower side of the body 103. In the box main body 101, the upper cover 104 is assembled to the vertically upper side of the body 103, and the lower cover 105 is assembled to the vertically lower side of the body 103 so that the opening of the vertically upper side of the body 103 faces the opening of the upper cover 104, and the opening of the vertically lower side of the body 103 faces the opening of the lower cover 105. In the box main body 101, the upper cover 104 and the lower cover 105 are locked with respect to the body 103 via various types of locking mechanisms 106. Further, although a laminating direction of the body 103, the upper cover 104 and the lower cover 105 follows a vertical direction typically in a state in which the electric connection box 100 is connected to the engine room or the like, in some cases, the laminating direction may be installed to have a predetermined angle with respect to the vertical direction depending on the installation situations of the electric connection box 100.

Further, as the various electronic components 102 assembled to the inner housing space of the box main body 101, the electronic component unit 1 of this embodiment is included, together with the connector, the fuse, the relay, the branch and the electronic control unit as described above. In the electric connection box 100, the above-described various electronic components 102 are assembled inside a plurality of cavities formed by various shapes of partition walls 107 integrally formed with the body 103, and various shapes of blocks 108 detachably assembled to the body 103. In this case, the partition wall 107, the block 108 and the like are also formed of an insulating synthetic resin, similarly to the body 103 or the like. Further, in the electric connection box 100, terminals or the like of the electric wire 151 wired via an opening 109 or the like are fitted and electrically connected to the cavity in which various electronic components 102 are assembled, from the vertically lower side.

Further, the electronic component unit 1 and a bus bar plate 2 of this embodiment are assembled to the electric connection box 100 to form a part of a power distribution circuit that distributes the power supplied from the power source of the electric connection box 100 to the various electronic devices in the vehicle. As illustrated in FIG. 2, the electronic component unit 1 is equipped with the bus bar plate 2 and a housing 3, and the bus bar plate 2 is assembled inside the housing 3.

As illustrated in FIGS. 2, 3 and 5, the bus bar plate 2 is a substrate on which electronic components 22 with metallic bus bars 24 (illustrated in FIG. 4) built-in inside a resin material 23 are mounted. The bus bar plate 2 is configured to include a substrate main body 21 and the electronic component 22.

The substrate main body 21 is configured so that the plurality of electrically conductive bus bars 24 is built in the resin material 23, in other words, the plurality of bus bars 24 is covered with the insulating resin material 23 to be insulated from each other. The substrate main body 21 is formed, for example, by insert-molding in which an insulating resin is injected around the bus bars 24 formed by a conductive metal and disposed in a metal mold to integrate the metal and resin.

Bus bar assembly 24a before molding illustrated in FIG. 4 illustrates an assembly of the bus bar 24 before the insert-molding in which the plurality of bus bars 24 is connected by a carrier 24b. The bus bar assembly 24a before molding is formed by a conductive metal, and is formed, for example, in a substantially plate shape as a whole by press-machining or the like. The bus bar assembly 24a before molding is inserted into the insert-molding metal mold in a state in which terminals 24c of each bus bar 24 are bent. The substrate main body 21 is formed by injecting an insulating resin around the bus bar assembly 24a before molding inserted to the metal mold to mold each of the bus bars 24 and the resin material 23 integrally. Further, in the substrate main body 21, the carrier 24b is cut after integrally molding each of the bus bars 24 and the resin material 23. The substrate main body 21 is formed in a rectangular plate shape as a whole.

As illustrated in FIGS. 3, 5 and the like, in the insert-molded substrate main body 21, the terminals 24c of the respective bus bars 24 are located at a substantially center of a short-side direction (a first width direction) side by side along a long-side direction (a second width direction perpendicular to the first width direction). Here, the terminals 24c are aligned in two rows along the long-side direction. Each terminal 24c is erected substantially perpendicularly to a mounting surface 25 that is a surface on which the electronic components 22 are mounted in the substrate main body 21. That is, the respective terminals 24c extend to protrude from the mounting surface 25 along a direction perpendicular to the short-side direction and the long-side direction. The respective terminals 24c are located between the plurality of relays 22a to be described later with respect to the short-side direction. In other words, the plurality of terminals 24c is concentrated at the center of the mounting surface 25. Moreover, in the substrate main body 21, the end of the side, of each bus bar 24, connected to the carrier 24b cut after the insert-molding becomes an exposed end 24d exposed from the resin material 23 at the end surface of the substrate main body 21. That is, in the bus bar plate 2, the plurality of exposed ends 24d of the bus bar 24 is exposed at the end surface. The exposed ends 24d are formed on each of a pair of long-side end surfaces facing each other in the substrate main body 21. The plurality of exposed ends 24d is exposed side by side in the long-side direction at the end surface of each long-side.

The electronic components 22 are mounted on the mounting surface 25 of the substrate main body 21, and here, the electronic components 22 are elements that exhibit various functions. The respective terminals of the electronic components 22 are electrically connected to a predetermined bus bar 24 and are fixed on the rear surface of the mounting surface 25 by soldering or the like. Relays 22 (hereinafter, indicated by reference numerals 22a) and resistors 22 (hereinafter, indicated by reference numerals 22b) are used as the electronic components 22 of this embodiment. That is, the electronic component unit 1 of this embodiment is a relay unit module. In the bus bar plate 2 of this embodiment, a total of six relays 22a as the electronic components 22 are provided so that three relays each are provided side by side on both sides in the short-side direction of the respective terminals 24c along the long-side direction. In other words, in the bus bar plate 2, the relays 22a are disposed in two rows, and the plurality of terminals 24c is disposed in two rows between the relays 22a disposed in two rows. The bus bar plate 2 of the present embodiment is basically in the form of a substantially linear symmetry with respect to the center line along the long-side direction of the substrate main body 21 (the center line in the short-side direction), and the placement of the terminals 24c and the relays 22a is also a substantially linear symmetry. Further, in the bus bar plate 2, the resistors 22b as the electronic components 22 are mounted in the vicinity of the respective relays 22a. Further, the resistor 22b is equivalent to the electronic component disclosed in the scope of the claims. As illustrated in FIGS. 3 and 5, the resistor 22b has a main body 28 having a cylindrical external appearance, and a pair of terminals 29 which protrudes in opposite directions from both ends in the axial direction of the main body 28. The terminal 29 is formed in a circular cross section.

The bus bar plate 2 is assembled inside the housing 3. As illustrated in FIG. 2, the housing 3 has a base cover 31, a top cover 32 and a connector fitting 33. The bus bar plate 2 is assembled to the base cover 31. The top cover 32 covers the bus bar plate 2 assembled to the base cover 31 from the opposite side of the base cover 31. A connector (not illustrated) as a connection between the terminal 24c (illustrated in FIG. 3) of the bus bar 24 of the bus bar plate 2 and the electric wire 151 is fitted to the connector fitting 33 from the lower side of FIG. 2, and the connector fitting 33 is integrally formed on the base cover 31. The base cover 31, the top cover 32 and the connector fitting 33 are formed of an insulating synthetic resin.

Specifically, as illustrated in FIG. 2, the base cover 31 is a dish-like (tray-like) member. The base cover 31 is configured to include a rectangular frame-like section 31a formed in a substantially square shape, and a bottom 31b that closes the rectangular frame-like section 31a. The bottom 31b is formed in a rectangular plate shape that is the same shape as the substrate main body 21 of the bus bar plate 2. The rectangular frame-like section 31a is formed to surround the edge of the bottom 31b. The bottom 31b is formed integrally with the rectangular frame-like section 31a in the middle of the rectangular frame-like section 31a. In the rectangular frame-like section 31a, notches 31d are formed in each of a pair of long-side wall surfaces 31c along the long-side direction of the bottom 31b, and locking claws 31e for being locked to the top cover 32 are formed. Further, in the rectangular frame-like section 31a, locking claws 31g for being locked to the box main body 101 of the electric connection box 100 are formed in each of a pair of short-side wall surfaces 31f along the short-side direction of the bottom 31b. The base cover 31 is formed in a rectangular tubular shape (partially cut by the notches 31d) in which the middle of the rectangular frame-like section 31a is closed by the bottom 31b. In the base cover 31, a space surrounded by the rectangular frame-like section 31a and the bottom 31b is divided as a housing space that houses the relay 22a of the bus bar plate 2.

In the base cover 31, a central wall-shaped section 31i is formed at the center of the bottom 31b. The central wall-shaped section 31i is formed so that the bottom 31b protrudes into housing space 31h side. The central wall-shaped section 31i is formed along the long-side direction at the substantially center in the short-side direction of the bottom 31b. The central wall-shaped section 31i extends from one short-side wall surface 31f to the other short-side wall surface 31f along the long-side direction. On a leading end surface of the central wall-shaped section 31i, a plurality of terminal fitting holes 31j and a pair of screw holes 31k are formed. The terminal fitting holes 31j are holes to which the terminals 24c of the respective bus bars 24 mentioned above are fitted when the bus bar plate 2 is assembled to the base cover 31, and the terminal fitting holes corresponding in number to the respective terminals 24c are formed at the positions corresponding to the respective terminals 24c. Here, the terminal fitting holes 31j are aligned in two rows along the long-side direction. The screw holes 31k are holes to which screws 26 for fastening the bus bar plate 2 to the base cover 31 are screwed when the bus bar plate 2 is assembled to the base cover 31.

Furthermore, in the base cover 31, the rear surface side of the central wall-shaped section 31i, that is, the opposite side of the housing space 31h has a hollow shape, and the hollow section is formed as a connector fitting 33 to which the connector serving as a connection with the electric wire 151 is fitted. The terminals 24c of the above-mentioned each bus bar 24 are exposed into the connector fitting 33 via the respective terminal fitting holes 31j in a state in which the bus bar plate 2 is assembled to the base cover 31. Here, the connector fittings 33 are formed at two locations, and a total of two connectors 4 are fitted so that each connector is fitted to each of the two connector fittings 33. That is, in the electronic component unit 1 of this embodiment, the two connectors are connected to the terminals 24c of the plurality of bus bars 24.

As illustrated in FIG. 2, the top cover 32 is a lid-like member. The top cover 32 is configured to include a rectangular frame-like section 32a formed in a substantially square shape, and a ceiling 32b that closes one opening of the rectangular frame-like section 32a. The ceiling 32b is formed in a rectangular plate shape having the same shape as the substrate main body 21 of the bus bar plate 2, and the bottom 31b of the base cover 31. The rectangular frame-like section 32a is formed so as to be erected at the edge of the ceiling 32b. In the rectangular frame-like section 32a, locking recesses 32d for being locked to the base cover 31 are formed on a pair of long-side wall surfaces 32c along the long-side direction of the ceiling 32b. Further, in the rectangular frame-like section 32a, notches 32f are formed on each of a pair of short-side wall surfaces 32e along the short-side direction of the ceiling 32b. The top cover 32 is formed in a rectangular tubular shape (partially cut by the notches 32f) in which one end is open and the other end is closed by the rectangular frame-like section 32a and the ceiling 32b.

The electronic component unit 1 configured as described above constitutes a single module by fitting the connector (not illustrated) to the connector fitting 33 in a state in which the bus bar plate 2 is assembled to the base cover 31 and the opposite side of the bus bar plate 2 to the base cover 31 is covered with the top cover 32. Further, the electronic component unit 1 constitutes a wire harness 150 wired in a vehicle such as an automobile, together with a plurality of electric wires 151 (illustrated in FIG. 1) in which the terminals and the like are attached to the connector. That is, the wire harness 150 includes the electronic component unit 1, and the plurality of electric wires 151 electrically connected to the electronic component unit 1.

More specifically, in the electronic component unit 1, in a positional relation in which the relays 22a of the bus bar plate 2 are housed in the housing space 31h of the base cover 31, that is, in a positional relation in which the mounting surface 25 (see, for example, FIG. 3) on which the relays 22a are mounted faces the bottom 31b of the base cover 31, the bus bar plate 2 is assembled to the base cover 31. In the electronic component unit 1, in a state in which the bus bar plate 2 is assembled to the base cover 31, the terminals 24c of the plurality of bus bars 24 of the bus bar plate 2 are fitted to the respective terminal fitting holes 31j of the base cover 31, and the terminals 24c are exposed to the interior of the connector fitting 33 along a direction perpendicular to the short-side direction and the long-side direction. When the electronic component unit 1 is inserted into a screw hole 27 of the bus bar plate 2 and is screwed with the screw hole 31k of the base cover 31, the bus bar plate 2 and the base cover 31 are fastened. In the electronic component unit 1, in a state in which the bus bar plate 2 is assembled to the base cover 31, three relays 22a each are located on both sides in the short-side direction of the central wall-shaped section 31i.

In the electronic component unit 1, in a positional relation in which the bus bar plate 2 assembled to the base cover 31 is covered with the top cover 32 from the opposite side of the base cover 31, the top cover 32 is mounted on the base cover 31 or the like. In the electronic component unit 1, in a state in which the top cover 32 is attached at an appropriate position, when the respective locking recesses 32d of the top cover 32 side are locked to the respective locking claws 31e of the base cover 31 side, the top cover 32 is assembled to the base cover 31. In the electronic component unit 1, in a state in which the top cover 32 is assembled to the base cover 31, the rectangular frame-like section 32a of the top cover 32 is located to overlap the outside of the rectangular frame-like section 31a of the base cover 31, and the locking claws 31g are exposed from the notches 32f of the top cover 32. Further, in the electronic component unit 1, when the connector is fitted to the connector fitting 33 along a direction perpendicular to the short-side direction and the long-side direction, the connector is connected to the terminals 24c of the plurality of bus bars 24 and is assembled at a predetermined position inside the box main body 101 of the electric connection box 100 via the respective locking claws 31g.

Further, the laminating direction of the base cover 31, the bus bar plate 2 and the top cover 32 follows the vertical direction in a state in which the electric connection box 100 is connected to the engine room or the like, similarly to the above-mentioned electric connection box 100. However, in some cases, depending on the installation situations of the electric connection box 100, the laminating direction may be installed to have a predetermined angle with respect to the vertical direction.

Incidentally, in the bus bar plate 2 of the electronic component unit 1 according to this embodiment, as illustrated in FIGS. 3, 5 and 6, since the substrate main body 21 has a component mounting section 4 on which the resistor 22b is mounted, the positioning of the resistors 22b to the mounting surface 25 is facilitated, thereby improving the workability at the time of assembling. In this embodiment, since the bus bar plate 2 has a plurality of resistors 22b, the component mounting section 4 on which the entire resistors are mounted desirably has a configuration illustrated in FIGS. 3, 5 and 6. However, in the electronic component unit 1 and the bus bar plate 2, the component mounting section 4 on which at least one of the plurality of resistors 22b is mounted may be configured as illustrated in FIGS. 3, 5 and 6.

Specifically, the component mounting section 4 is intended to mount the resistor 22b on the mounting surface 25 and corresponds to the resistors 22b on a one-to-one basis. The component mounting section 4 is disposed in the vicinity of each relay 22a. As illustrated in FIG. 6, the component mounting section 4 is provided with a pair of through-holes 41, and a recess 42 provided between the pair of through-holes 41.

The through-hole 41 penetrates the resin material 23 and the bus bar 24 of the substrate main body 21, and in this embodiment, its planar shape is formed in a circular shape. As illustrated in FIG. 7, the through-hole 41 is provided with a hole 41a that penetrates the resin material 23, and a hole 41b that penetrates the bus bar 24. A single terminal 29 of the resistor 22b passes inside the through-hole 41. An inner diameter of the through-hole 41 is formed to be larger than an outer diameter of the terminal 29. Therefore, when the terminal 29 passes inside the through-hole 41, a gap is formed between the through-hole 41 and the terminal 29. The terminal 29 passing inside the through-hole 41 is freely movable in the through-hole 41.

The recess 42 is capable of supporting the main body 28 of the resistor 22b with the terminal 29 passed inside the through-hole 41 and suppresses a positional displacement of the main body 28 with respect to the mounting surface 25. The recess 42 is formed integrally with the resin material 23 to be recessed from the mounting surface 25 of the resin material 23. The recess 42 is not formed in the bus bar 24 and does not penetrate the resin material 23. As illustrated in FIG. 6, the recess 42 extends in a straight line shape that connects the centers of a pair of through-holes 41 in a plan view. In addition, as illustrated in FIG. 7, the recess 42 is formed in a V-shaped cross section. In the cross-section of the recess 42, a distance D between a pair of corners 42a intersecting with the mounting surface 25 is smaller than an outer diameter R of the main body 28 of the resistor 22b. The outer diameter R of the main body 28 of the resistor 22b indicates the outer diameter of the thickest position, when the outer diameter R of the main body 28 changes in the axial direction.

In the component mounting section 4 of the configuration described above, when the pressing is performed on the conductive metal constituting the bus bar assembly 24a before molding, a hole 41b which penetrates the bus bars 24 is formed, and the hole 41a and the recess 42 that penetrate the resin material 23 can be obtained when insert-molding the substrate main body 21.

As described below, the component mounting section 4 of the above-described configuration mounts the resistor 22b on the mounting surface 25. First, in the bus bar plate 2, the mounting surface 25 faces upward, and the mounting surface 25 is parallel to the horizontal direction. The terminal 29 of the resistor 22b bent at a position that can pass through the through-hole 41 passes through the through-hole 41, and the main body 28 of the resistor 22b is placed on the recess 42. Then, in a cross-section, two corners 42a of the recess 42 support the main body 28. At this time, since the recess 42 is formed in a V-shaped cross section, only the corners 42a are in contact with the main body 28, and the main body 28 is supported at only two points in the cross section. Thus, the main body 28 is restricted from rotating around the axis. Further, after the terminal 29 of the resistor 22b is further bent on the rear surface side of the mounting surface 25, the terminal 29 is fixed with the bus bar 24 on the rear surface side, by reflow soldering or the like. Thus, the component mounting section 4 mounts the resistor 22b on the mounting surface 25.

According to the electronic component unit 1 as described above, it is provided with a bus bar plate 2 in which a metallic bus bar 24 is built in a resin material 23 and the relay 22a and the resistor 22b are mounted, and a housing 3 in which the bus bar plate 2 is internally assembled. The bus bar plate 2 is provided with the component mounting section 4 that mounts the resistor 22b. The component mounting section 4 is provided with a pair of through-holes 41 that penetrates the resin material 23 and the bus bars 24 to allow the terminal 29 of the resistor 22b to pass, and the recess 42 that extends in a straight line shape connecting the pair of through-holes 41 to each other to support the main body 28 of the resistor 22b.

Thus, as illustrated in FIG. 6 or the like, in the electronic component unit 1 and the bus bar plate 2, when the terminal 29 passes inside the through-hole 41 and the main body 28 is supported by the recess 42, the main body 28 of the resistor 22b is positioned on a straight line that connects the pair of through-holes 41 with each other. As a result, the electronic component unit 1 and the bus bar plate 2 exhibit effects capable of positioning the resistor 22b at a predetermined position, suppressing the positional displacement of the resistor 22b when soldering or the like, fixing the resistor 22b at a predetermined position of the mounting surface 25, and improving the workability at the time of assembling.

Further, in the electronic component unit 1 and the bus bar plate 2, since the recess 42 of the component mounting section 4 is formed integrally only with the resin material 23, the component mounting section 4 can position a wide variety of resistors 22b on the mounting surface 25. Thus, the electronic component unit 1 and the bus bar plate 2 can mount the wide variety of resistors 22b on the mounting surface 25.

Further, in the electronic component unit 1 and the bus bar plate 2, a since recess 42 is formed in a V-shaped cross section and the distance D between the pair of corners 42a of the recess 42 is smaller than the outer diameter R of the main body 28, when the recess 42 supports the main body 28, the main body 28, that is, the resistor 22b is supported only by the pair of corners 42a. As a result, even in the case of the resistor 22b having the main body 28 formed in a cylindrical shape, the component mounting section 4 of the bus bar plate 2 can regulate the main body 28 from rotating around the axis and can position the resistor 22b on the recess 42. Thus, the electronic component unit 1 and the bus bar plate 2 exhibit effects that are capable of positioning the resistor 22b at a predetermined position, suppressing the positional displacement of the resistor 22b when soldering or the like, and fixing the resistor 22b at a predetermined position on the mounting surface 25.

Furthermore, in the electronic component unit 1 and the bus bar plate 2, since the distance D between the pair of corners 42a of the recess 42 is smaller than the outer diameter R of the main body 28, even when the through-hole 41 is formed to be larger than the outer diameter of the terminal 29, the main body 28, that is, the resistor 22b is supported only by the pair of corners 42a of the recess 42. Thus, the electronic component unit 1 and the bus bar plate 2 exhibit effects that are capable of positioning the resistor 22b at a predetermined position, suppressing the positional displacement of the resistor 22b when soldering or the like, and fixing the resistor 22b at a predetermined position on the mounting surface 25.

Since the wire harness 150 as described above is provided with the electronic component unit 1 and the bus bar plate 2, the wire harness 150 exhibits effects that are capable of positioning the resistor 22b at a predetermined position, suppressing the positional displacement of the resistor 22b when soldering or the like, fixing the resistor 22b at a predetermined position on the mounting surface 25, and improving the workability at the time of assembling.

First Modified Example

Figure 8:
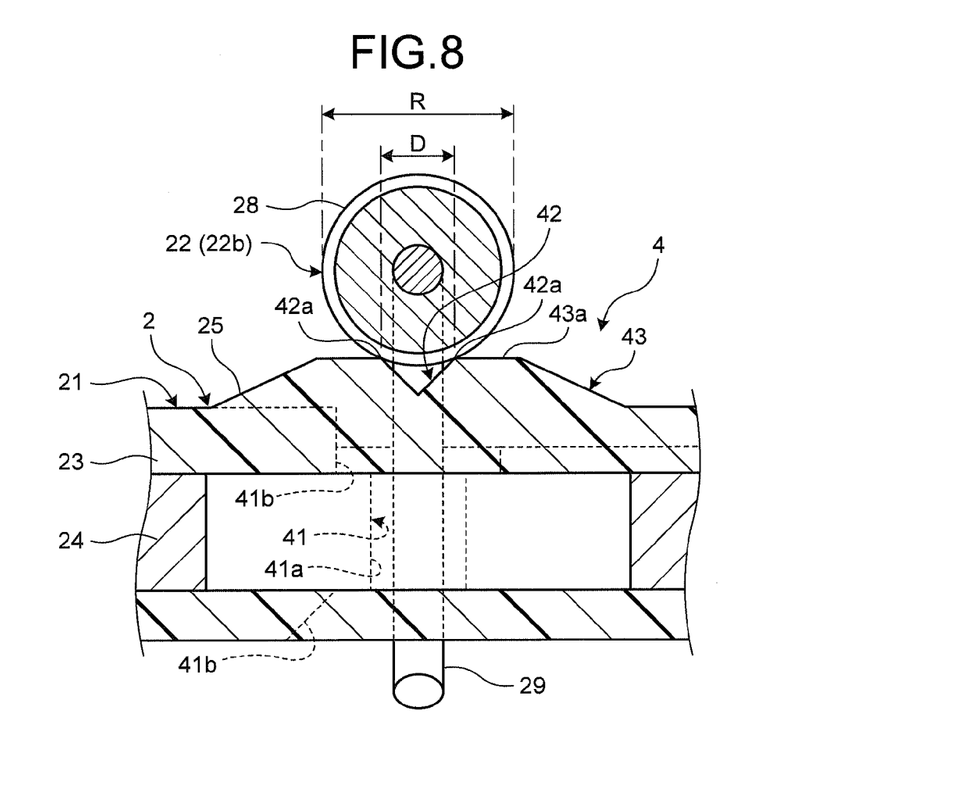
FIG. 8 is a cross-sectional view of a component mounting section of a bus bar plate of an electronic component unit according to a first modified example according to the embodiment.

Next, a bus bar plate 2 according to a first modified example of the embodiment will be described with reference to FIG. 8. FIG. 8 is a cross-sectional view of a component mounting section of the bus bar plate of the electronic component unit according to a first modified example of the embodiment. In FIG. 8, the same parts as in the embodiment are denoted by the same reference numerals, and the description thereof will not be provided.

In the bus bar plate 2 of the electronic component unit 1 according to the first modified example of the embodiment, the component mounting section 4 is provided with a protrusion 43 protruding from the mounting surface 25 of the resin material 23. The protrusion 43 is provided between the pair of through-holes 41 and is formed integrally with the resin material 23. An upper surface 43a of the protrusion 43 is formed flat in parallel to the mounting surface 25. The recess 42 is provided on the upper surface 43a of the protrusion 43.

With the bus bar plate 2 of the electronic component unit 1 according to the first modified example, as in the embodiment, the bus bar plate 2 exhibit effects capable of positioning the resistor 22b at a predetermined position, suppressing the positional displacement of the resistor 22b when soldering or the like, fixing the resistor 22b at a predetermined position on the mounting surface 25, and improving the workability at the time of assembling.

Second Modified Example

Figure 9:
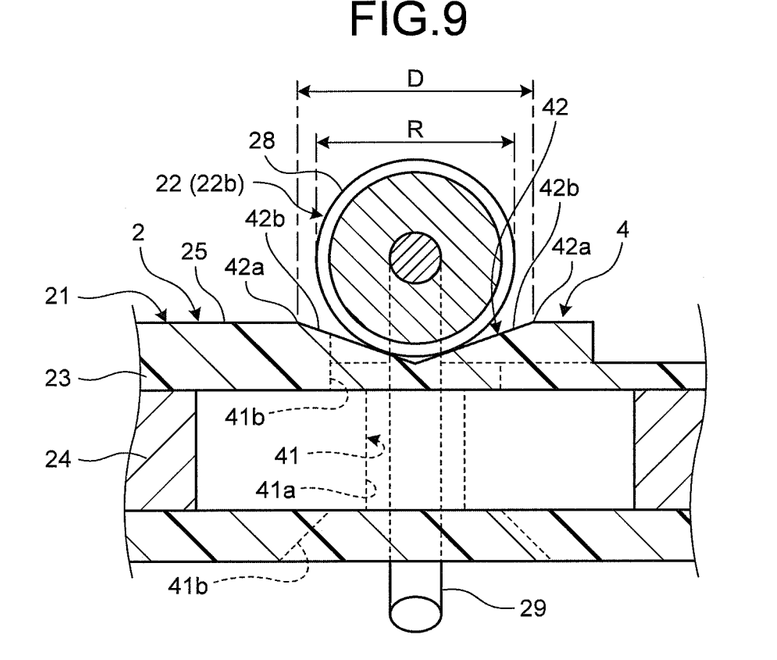
FIG. 9 is a cross-sectional view of a component mounting section of a bus bar plate of an electronic component unit according to a second modified example according to the embodiment.

Next, a bus bar plate 2 according to a second modified example of the embodiment will be described with reference to FIG. 9. FIG. 9 is a cross-sectional view of a component mounting section of a bus bar plate of an electronic component unit according to the second modified example of the embodiment. In FIG. 9, the same parts as in the embodiment are denoted by the same reference numerals, and the description thereof will not be provided.

In the bus bar plate 2 of the electronic component unit 1 according to the second modified example of the embodiment, in the component mounting section 4, the distance D between the corners 42a of the recess 42 is set to be larger than the outer diameter R of the main body 28 of the resistor 22b. Thus, in the component mounting section 4, the recess 42 is supported only by two points of an inner surface 42b in the cross-section, thereby suppressing the positional displacement of the main body 28 of the resistor 22b. Further, in the component mounting section 4, the distance D between the corners 42a of the recess 42 is set to be larger than the outer diameter R of the main body 28 of the resistor 22b, thereby suppressing an amount of protrusion of the resistor 22b after mounting from the mounting surface 25.

With the bus bar plate 2 of the electronic component unit 1 according to the second modified example, as in the embodiment, the bus bar plate 2 exhibit effects capable of positioning the resistor 22b at a predetermined position, suppressing the positional displacement of the resistor 22b when soldering or the like, fixing the resistor 22b at a predetermined position on the mounting surface 25, and improving the workability at the time of assembling. Further, with the bus bar plate 2 of the electronic component unit 1 according to the second modified example, the bus bar plate 2 exhibits an effect that is capable of suppressing the amount of protrusion of the resistor 22b after mounting from the mounting surface 25, thereby suppressing an increase in size.

The above-described electronic component unit according to the embodiment and the modified examples of the present invention is not limited to the embodiment and modified examples described above, and various modifications can be made within the scope of the claims.

Although the electronic component unit 1 described above has been described as constituting an electronic component module that is detachably assembled to the electric connection box 100, it is not limited thereto. The configuration of the electronic component unit of this embodiment, for example, may also be applied to the electric connection box 100 itself.

The component mounting section 4 of the bus bar plate 2 described above mounted the resistor 22b as an electronic component, but may mount electronic components other than the resistor 22b, for example, a diode.

In the bus bar plate according to the present invention, a component mounting section is provided with a pair of through-holes through which the terminals pass, and a recess that is disposed between the pair of through-holes to support a main body of the electronic component. Further, the bus bar plate extends in a linear direction that the recess connects the pair of through-holes to each other. Thus, when terminals of the bus bar plate pass inside the through-holes and the main body is supported by the recess, the main body of the electronic component is positioned on the straight line that connects the pair of through-holes to each other. As a result, the bus bar plate can position the electronic component on the recess, thereby exhibiting an effect that is capable of positioning the electronic components at a predetermined position and improving the workability at the time of assembling.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A bus bar plate comprising:
an electronic component having a main body and a pair of terminals protruding from the main body; and
a substrate main body in which a metallic bus bar is encased within a resin material and which has a component mounting section with the electronic component mounted thereon, wherein
the component mounting section includes:
a pair of through-holes that collinearly penetrates the resin material above and below the bus bar and the bus bar, the pair of through-holes allowing the terminals to pass through the resin material and the bus bar; and
a recess that is provided between the pair of through-holes, extends in a straight line shape connecting the pair of through-holes, and is capable of supporting the main body of the electronic component,
wherein the recess is formed in a V-shaped cross-section.
2. The bus bar plate according to claim 1, wherein the recess is formed within the resin material.
3. An electronic component unit comprising:
a bus bar plate equipped with an electronic component that has a main body and a pair of terminals protruding from the main body, and a substrate main body in which a metallic bus bar is encased within a resin material and which has a component mounting section with the electronic component mounted thereon; and
a housing in which the bus bar plate is internally assembled, wherein the component mounting section includes:
- a pair of through-holes that collinearly penetrates the resin material above and below the bus bar and the bus bar, the pair of through-holes allowing the terminals to pass through the resin material and the bus bar; and
- a recess that is provided between the pair of through-holes, extends in a straight line shape connecting the pair of through-holes, and is capable of supporting the main body of the electronic component, wherein the recess is formed in a V-shaped cross-section.

4. A wire harness comprising:
an electronic component unit that is provided with a bus bar plate, and a housing in which the bus bar plate is internally assembled, the bus bar plate being equipped with an electronic component that has a main body and a pair of terminals protruding from the main body, and a substrate main body in which a metallic bus bar is encased within a resin material and which has a component mounting section with the electronic component mounted thereon; and
an electric wire that is electrically connected to the electronic component unit, wherein
the component mounting section includes:
- a pair of through-holes that collinearly penetrates the resin material above and below the bus bar and the bus bar, the pair of through-holes allowing the terminals to pass through the resin material and the bus bar; and
- a recess that is provided between the pair of through-holes, extends in a straight line shape connecting the pair of through-holes, and is capable of supporting the main body of the electronic component, wherein the recess is formed in a V-shaped cross-section.

5. The bus bar plate according to claim 1, wherein
a distance between a pair of corners of the recess, which intersect a mounting surface of the component mounting section, is smaller than an outer diameter of a thickest portion of the main body of the electronic component.

6. The bus bar plate according to claim 1, wherein
a distance between a pair of corners of the recess, which intersect a mounting surface of the component mounting section, is larger than an outer diameter of a thickest portion of the main body of the electronic component.

7. The bus bar plate according to claim 1, wherein
the component mounting section comprises a unitary protrusion protruding from a mounting surface of the component mounting section, and
the recess is formed within an upper surface of the unitary protrusion.

8. The bus bar plate according to claim 7, wherein
the protrusion is provided integrally and continuously with the resin material.

* * * * *